United States Patent
Takano et al.

(10) Patent No.: US 6,754,952 B2
(45) Date of Patent: Jun. 29, 2004

(54) PROCESS FOR MANUFACTURING MULTIPLE LAYER WIRING SUBSTRATE ONTO WHICH THIN FILM CAPACITOR IS INCORPORATED

(75) Inventors: Akihito Takano, Nagano (JP); Akira Fujisawa, Nagano (JP); Akio Rokugawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/291,468

(22) Filed: Nov. 12, 2002

(65) Prior Publication Data

US 2003/0088978 A1 May 15, 2003

(30) Foreign Application Priority Data

Nov. 12, 2001 (JP) ........................................ 2001-346130

(51) Int. Cl.$^7$ ........................... H01K 3/10; C23C 14/00; B05D 5/12; H01B 13/00
(52) U.S. Cl. ............................ 29/852; 29/831; 29/846; 29/847; 204/192.15; 427/96; 427/97; 216/14; 216/18
(58) Field of Search ........................ 29/852, 829, 830, 29/898, 831, 846, 847, 844, 25.41, 25.42; 216/14, 18, 56, 65, 39, 41, 6, 49; 427/96, 97, 98, 79; 204/192.17, 192.15

(56) References Cited

U.S. PATENT DOCUMENTS 5,027,253 A * 6/1991 Lauffer et al. ........... 361/321.4
5,335,138 A * 8/1994 Sandhu et al. ............... 361/303
5,406,446 A * 4/1995 Peters et al. ............. 361/306.1
5,455,064 A * 10/1995 Chou et al. .................... 427/71
5,648,146 A * 7/1997 Gotou et al. ................. 428/209
5,912,044 A * 6/1999 Farooq et al. ................. 427/79

FOREIGN PATENT DOCUMENTS

JP      2001-110675      4/2001

* cited by examiner

Primary Examiner—A. Dexter Tugbang
Assistant Examiner—Tai Nguyen
(74) Attorney, Agent, or Firm—Staas & Halsey LLP

(57) ABSTRACT

A process facilitates manufacturing a multiple layer wiring board having therein a thin-film capacitor The process includes: forming a metallic film layer having a barrier metal layer and a metal layer to be sequentially anode oxidized on an insulating layer first conductor pattern; covering a lower electrode forming region of the thin film capacitor in the first conductor pattern with a first resist film; etching to remove an uncovered portion of the metallic film layer; removing the first resist film and covering the first conductor pattern, except for part of the metallic film layer, with a second resist film; forming an anodic oxidation film on the exposed metallic film layer; removing the second resist film and attaching an adherence layer and a metal seed layer, sequentially, on the anodic oxidation film end on the first conductor pattern; and forming an upper electrode second conductor pattern on the anodic oxidation film.

6 Claims, 3 Drawing Sheets

PROCESS FOR MANUFACTURING MULTIPLE LAYER WIRING SUBSTRATE ONTO WHICH THIN FILM CAPACITOR IS INCORPORATED

BACKGROUND OF THE INVENTION

1. Field of the Invention

The present invention relates to a process for manufacturing a multiple layer wiring substrate composed in such a manner that a thin film capacitor element is incorporated onto a substrate on which multiple layers of conductor patterns are formed via insulating layers.

2. Description of the Related Art

Concerning the wiring substrate on which a plurality of electronic parts such as semiconductor elements and semiconductor packages are mounted, in order to enhance the electric characteristics of these parts and circuit, a technique has been proposed by which a thin film capacitor is formed on a multiple layer wiring substrate by applying a substrate manufacturing technique of laminating sheets such as a build-up method or subtractive method. This technique is disclosed in Japanese Unexamined Patent Publication No. 2001-110675, published on Apr. 20, 2001 (corresponding to U.S. patent application Ser. No. 09/679,328) now U.S. Pat. No. 6,498,714. This thin film capacitor is formed as follows. For example, thin films of Ti (titanium) and Ta (tantalum) are successively attached onto a substrate of copper or a wiring layer (lower electrode) so that a metallic film layer is formed. This metallic film layer is subjected to anodic oxidation in an appropriate electrolyte so that a dielectric layer is formed, and then an upper electrode of a thin film of Au (gold) or Cu (copper) is formed on the thus formed dielectric layer by a method of vacuum vapor deposition or a method of sputtering. The reason why the thin film of Ti is attached onto the substrate of copper or the wiring layer is that a barrier layer is formed for suppressing the diffusion of copper ions into the thin film of Ta in the process of anodic oxidation and for preventing copper ions from dissolving into the electrotytic solution and that the adherence strength of the thin film of Ta with respect to the substrate is enhanced.

The thin film capacitor is incorporated onto the copper substrate or wiring layer in the manufacturing process of a multiple layer wiring substrate. Therefore, unless patterning is conducted, a thin metallic layer and anodic oxidation layer are formed on the wiring layer on the entire substrate, and the degree of freedom of designing the wiring on the multiple layer wiring substrate is deteriorated and further there is a possibility that the wiring is short-circuited in the interlayer connection which is accomplished through via holes.

In the case where anodic oxidation is conducted on the copper wiring layer, when pin holes or cracks are caused in a portion of the anodic oxidation film, copper ions are diffused into the thin metallic layer and the insulating property of the oxidation film is lost. Therefore, it becomes impossible to form an oxidation film of a predetermined thickness. The larger the area of the plate of the capacitor is, the higher the rate (percent) of defective anodic oxidation film is. Therefore, the yield is lowered.

SUMMARY OF THE INVENTION

The present invention has been accomplished to solve the above problems in the prior art.

It is an object of the present invention to provide a process for manufacturing a multiple layer wiring substrate characterized in that a plurality of thin film capacitors are formed, at the same time, by selectively conducting anodic oxidation in a limited area of the conductor pattern and that the rate (percent) of defective products is reduced.

According to the present invention, there is provided a process for manufacturing a multiple layer wiring board incorporated therein a thin-film capacitor, the process comprising the following steps of:

covering a first conductor pattern formed on an insulating layer, except for a lower electrode forming region of a thin film capacitor, with a first resist film;

forming a metallic film layer consisting of a barrier metal layer and tantalum metal layer, in this order, on an entire face of the first conductor pattern covered with the first resist film;

removing the first resist film to remove the metallic film layer, except for the lower electrode forming region, from a surface of the first conductive pattern;

covering a face of the first conductor pattern, except for the lower electrode forming region of the first conductor pattern, with a second resist film;

forming an anodic oxidation film on the metallic film layer exposed by the second resist film;

removing the second resist film and attaching an adherence layer and a metal seed layer, in this order, on the anodic oxidation film and on the conductor pattern; and forming a second conductor pattern, which becomes an upper electrode, on the anodic oxidation film.

The upper electrode of the second conductor pattern is formed by attaching the adherence layer and the metal seed layer onto the anodic oxidation film; and forming a thick plated layer on the metal seed layer.

The adherence layer and the metal seed layer are attached onto the anodic oxidation film by a sputtering method.

The thick plated layer is formed on the metal seed layer by subtractive method or semi-additive method.

The process further comprises the following steps of:

laminating an insulating resin layer on the second conductor pattern including the upper electrode;

drilling the insulating resin layer to form a via hole having a bottom thereof on the upper electrode;

via-hole plating to form a conductor layer extending from an inner wall of the via hole to an upper surface of the insulating resin layer; and etching and patterning the conductor layer to form the second conductor pattern which is connected with the upper electrode.

The metallic film layer is formed by any one of a sputtering method, a chemical vapor phase deposition (CVD) method, and a vapor deposition method.

According to another aspect of the present invention there is provided a process for manufacturing a multiple layer wiring board incorporated therein a thin-film capacitor, the process comprising the following steps of:

forming a metallic film layer consisting of a barrier metal layer and tantalum metal layer, in this order, on a first conductor pattern formed on an insulating layer;

covering a lower electrode forming region of a thin film capacitor in the first conductor pattern attached to the insulating layer with a first resist film;

etching to remove the metallic film layer, where is not covered with the first resist film;

removing the first resist film and covering a face of the first conductor pattern, except for a region on the metallic film layer, with a second resist film;

forming an anodic oxidation film on the metallic film layer exposed from the second resist film;

removing the second resist film and attaching an adherence layer and a metal seed layer, in this order, on the anodic oxidation film and on the first conductor pattern; and forming a second conductor pattern, which becomes an upper electrode, on the anodic oxidation film.

DETAILED DESCRIPTION OF THE PREFERRED EMBODIMENTS

A preferred embodiment of the present invention will be explained in detail below referring to the accompanying drawings.

In the embodiments, explanations will be made into a process for manufacturing a multiple layer wiring substrate, in a portion of the conductor pattern of which a thin film capacitor is formed. FIGS. 1(a) to 1(g) are sectional schematic illustrations showing an embodiment of a process of manufacturing a multiple layer wiring substrate, and FIGS. 2(a) to 2(d) are sectional schematic illustrations showing another embodiment of a process of manufacturing a multiple layer wiring substrate.

Figure 1A:
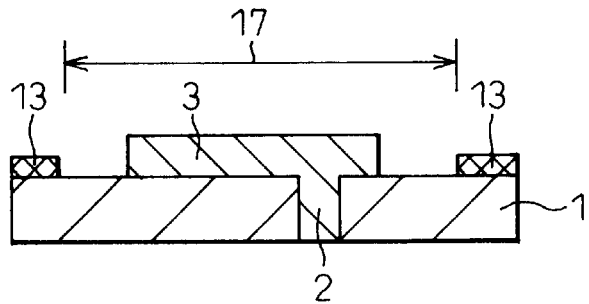
FIGS. 1(a) to 1(g) are sectional schematic illustrations showing an example of a process for manufacturing a multiple layer wiring substrate.

First, an outline of the structure of the multiple layer wiring substrate will be explained as follows. In FIG. 1(g), reference numeral 1 is a wiring substrate which becomes a core substrate. On this wiring substrate 1, conductor patterns such as a signal layer and electric power source layer/ground layer are laminated via insulating layers. In this case, sheet members are laminated by a well known build-up method or subtractive method. Concerning the interlayer connection of the conductor patterns, the conductor patterns are electrically connected to each other via the through-hole plating 2.

A part of the conductor pattern 3 of the wiring substrate 1 is used as a lower electrode 4. In a portion on this lower electrode 4, there is formed a metallic film layer 5 on which a barrier layer (thin metallic film of titanium in this embodiment) and a thin metallic film of Ta (tantalum) are attached in this order. On this metallic film layer 5, there is formed an anodic oxidation film 6. On the metallic film layer 5, there is formed a conductor pattern 7. On the anodic oxidation film 6, there is formed a conductor pattern 8 which defines an upper electrode. On the conductor patterns 3 and 7 and the upper electrode 8, there is formed a surface conductor pattern 10 via the insulating resin layer 9. The surface conductor patterns 10 and the conductor patterns 3, 7 and 8 are electrically connected to each other by the via hole plating 11. Onto the multiple layer wiring substrate 16 on which the conductor patterns 3, 7 and 8 are formed into a multiple layer via the insulating layers, the thin film capacitor element 12 is incorporated which includes the upper electrode (conductor pattern 8), anodic oxidation film 6, metallic film layer 5 and lower electrode 4 (a part of the conductor pattern 3).

Next, referring to FIGS. 1(a) to 1(g), a process for manufacturing the multiple layer wiring substrate is specifically explained below. In FIG. 1(a), on the wiring substrate 1 which defines a core substrate, there is provided a conductor pattern 3 and through-hole plating 2. On this wiring substrate 1, a surface of the conductor pattern 3 except for the lower electrode forming region 17 of the thin film capacitor element 12 is covered with a first resist film 13. Specifically, the first resist film 13 is formed in such a manner that photosensitive resist is coated on the surface of the conductor pattern 3 or alternatively a metal mask is formed being put on the surface of the conductor pattern 3. In this connection, instead of using the photosensitive resist, a dry film or adhesive polyimide tape may be used.

Onto the entire face of the conductor pattern 3 covered with the first resist film 13, a barrier layer (for example, Ti (titanium) film) and a metallic film of Ta (tantalum) are attached by a sputtering method, a chemical vapor phase deposition method (CVD method) or a vapor deposition method in this order, so that the metallic film layer 5 is formed. In this connection, the Ti (titanium) metal or the Ta (tantalum) metal may be titanium or tantalum a single metal. Alternatively, the metal of Ti (titanium) or the metal of Ta (tantalum) can be an alloy, the primary component of which is titanium or tantalum. The reason why the barrier layer (metallic film of Ti (titanium)) is attached onto the conductor pattern 3 is that a barrier layer is formed for suppressing the diffusion of copper ions, which are caused by a copper layer forming the conductor pattern, into the thin film of Ta (tantalum) in the process of anodic oxidation and for preventing copper ions from dissolving into the electrolyte solution and that the adherence strength of the thin film of Ta with respect to the substrate is enhanced.

The barrier layer can be made of various metallic materials. Specifically, a valve metal (a metal having a valve action), which does not need any heat treatment at high temperatures, is preferably used. Examples of valve metals are: aluminum (Al), tantalum (Ta), niobium (Nb), tungsten (W), molybdenum (Mo), vanadium (V), bismuth (Bi), titanium (Ti), zirconium (Zr), hafnium (Hf) and silicon (Si).

The above valve metal may be used as a single metal, however, two types of the above valve metal or not less than two types of the above valve metals may be used by being combined with each other. Further, the above valve metal may be used in the form of a compound, for example, Ti may be used in the form of TiN, and Ta may be used in the form of TaN. A mixture of a compound of one valve metal with a compound of another valve metal may be used. A mixture of a compound of one valve metal with another valve metal may be used. A mixture of a compound of one valve metal with other compounds may be used. An alloy of the valve metal may be used. An example of an alloy of the valve metal is titanium alloy (TiW).

Figure 1B:
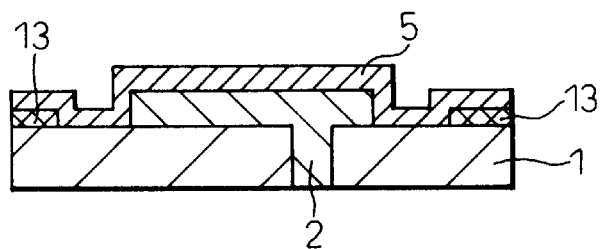

As described above, the conductor pattern 3 containing the lower electrode forming region 17 of the wiring substrate 1 is covered with the metallic film layer 5 in FIG. 1(b). The film thickness of the barrier layer of the metallic film layer 5 is, for example, 50 nm to 1 μm. It is preferable that the film thickness of the barrier layer is 100 nm. The film thickness of the metallic film layer of Ta is, for example, 100 nm to 2 μm. It is preferable that the film thickness of the metallic film layer of Ta is 500 nm.

Figure 1C:
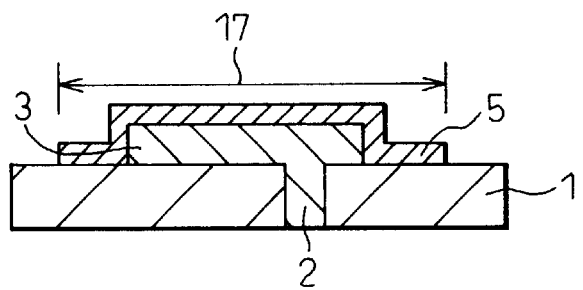

Next, in FIG. 1(c), the first resist film 13 is peeled off, and the metallic film layer 5 is removed from the surface of the conductor pattern 3 except for the lower electrode forming region 17 (the lift-off method). Specifically, in the case where the first resist film 13 is made of photosensitive resist, it is peeled off. In the case where the first resist film 13 is a metal mask, the metal mask, which is put on the wiring substrate 1, is removed.

Figure 1D:
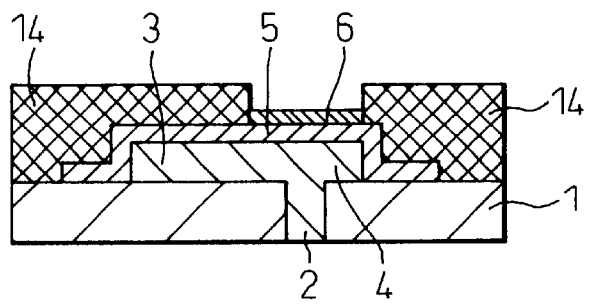
Figure 1E:
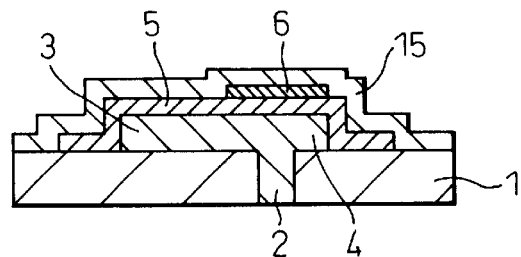

Next, in FIG. 1(d), the conductor pattern 3 except for the metallic film layer 5 attached to a portion which becomes the lower electrode 4 is covered with the second resist film 14. Specifically, a photosensitive resist is coated on the wiring substrate 1 and patterning is conducted, and a side of the metallic film layer 5 on the upper face side of the lower electrode 4 is removed. In this connection, instead of using the photosensitive resist, a dry film or an adhesive polyimide tape may be used as a second resist.

Next, anodic oxidation is conducted on the wiring substrate 1 so as to form an anodic oxidation film ($Ta_2O_5$) on a surface of the metallic film layer 5 exposed by the second resist film 14. That is, a dielectric layer is formed by anodic oxidation of the Ta layer. The anodic oxidation process can be performed, for example, by a method of constant current-constant voltage. Specifically, a solution of sodium citrate of 0.1% is used as an electrolyte, and the wiring substrate 1 on which the metallic film layer 5 is formed is connected with the anode and electrified. In this case, the intensity of the electric current is 10 $mA/cm^2$, which is kept constant, and the formation voltage of 200 V is impressed so as to conduct anodic oxidation. In this anodic oxidation process, the Ti metallic layer acts as a barrier layer. Therefore, when the metallic layer of Ta is subjected to anodic oxidation, this barrier layer prevents copper in the conductor pattern of the base from diffusing into the metallic layer of Ta.

In place of the metal layer of tantalum (Ta), a metal layer of aluminum (Al) or titanium (Ti) can be used, so that an anodic oxidization film of $Al_2O_3$ or $TiO_2$ is formed in this process of anodic oxidization.

Next, in FIG. 1(e), the second resist film 14 is peeled off, and an adherence layer and seed layer 15, which will be referred to as "an adherence/seed layer" in this specification hereinafter, are attached in this order onto the surfaces of the anodic oxidation film 6 and the metallic film layer 5. Specifically, the adherence layer (for example, a chromium (Cr) layer) is attached onto the anodic oxidation film 6 by the method of sputtering, so that the plating seed layer (copper (Cu) layer) is successively attached. The adherence layer is formed for enhancing the adherence strength with respect to the conductor patterns 7 and 8 formed in the upper portion thereof.

Figure 1F:
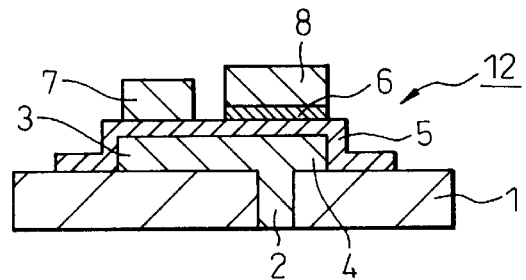
Figure 1G:
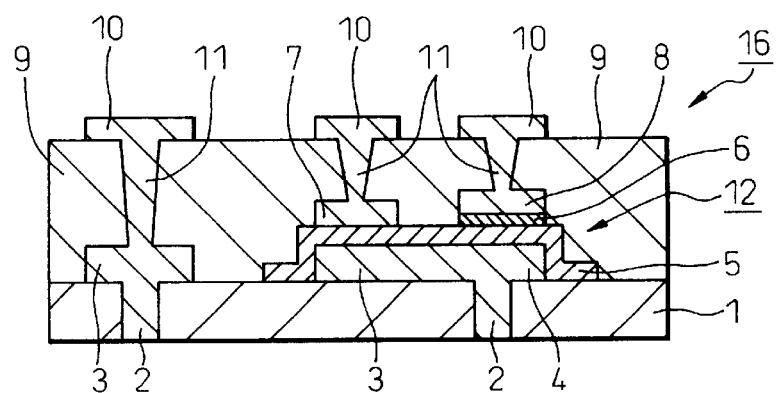

Then, in FIG. 1(f), electrolytic copper plating is conducted on the adherence/seed layer 15 by the subtractive method or the semi-additive method so as conduct plating of copper, and an unnecessary adherence/seed layer 15 is removed by means of etching, and the conductor patterns 7 and 8, which become an upper electrode, are formed. Due to the foregoing, the thin film capacitor element 12 can be integrally formed on the wiring substrate 1. In this connection, in FIGS. 1(f) and 1(g), as the adherence seed layer 15 is formed integrally with the conductor patterns 7 and 8, it is not shown in the drawings.

Next, the insulating resin layer (resin film) 9 is laminated on the wiring substrate 1 on which the thin film capacitor element 12 is formed. Next, via holes are formed on the insulating resin layer 9 by the carbonic acid gas ($CO_2$) laser beam method or the YAG laser beam method, so that via holes, the bottom portions of which are the conductor patterns 3, 7 and 8 are formed. Then, electroless copper plating and electrolytic copper plating are conducted to form a conductor layer (via hole plating 11) from the inner wall of the via hole to the surface of the insulating resin layer 9. Next, patterning is conducted on this conductor layer, and an unnecessary copper layer is removed by means of etching. Due to the foregoing, the surface conductor pattern 10, which is electrically connected with the conductor pattern 8 of the upper electrode and the conductor patterns 3 and 7 can be formed as shown in FIG. 1(g). In this way, a multiple layer wiring substrate 16 into which the thin film capacitor element 12 is built can be manufactured.

According to the aforementioned method of manufacturing the multiple layer wiring substrate, the thin film capacitor element 12 can be selectively formed only in the necessary portion on the wiring substrate 1. Therefore, it is possible to ensure the degree of freedom of the wiring design to accomplish an interlayer connection. According to the aforementioned method of manufacturing the multiple layer wiring substrate, the dielectric film is formed by partially conducting anodic oxidization on a specific conductor pattern on the wiring substrate 1. Therefore, it is possible to form the thin film capacitor elements 12 of various capacities at the same time and, further, it is possible to conduct anodic oxidization. Accordingly, it is possible to reduce the rate (percent) of defective dielectric film and enhance the yield of the thin film capacitor elements 12.

Next, referring to FIGS. 2(a) to 2(d), another embodiment of the method of manufacturing a multiple layer wiring substrate will be explained below. In this explanation, like reference characters are used to indicate like parts in FIG. 1 and FIGS. 2(a) to 2(d). As the manufacturing processes shown in FIGS. 1(d) to 1(g) are the same, the same explanations are used here.

Figure 2A:
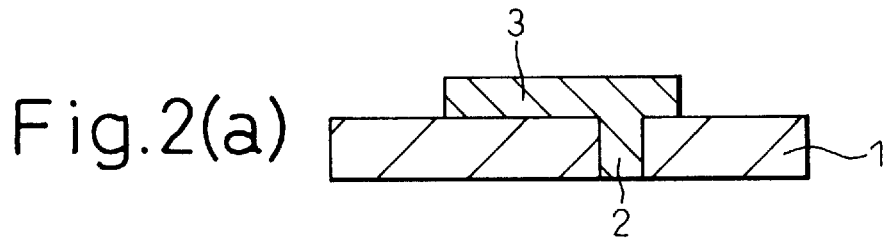
FIGS. 2(a) to 2(d) are sectional schematic illustrations showing another example of a process for manufacturing a multiple layer wiring substrate.
Figure 2B:
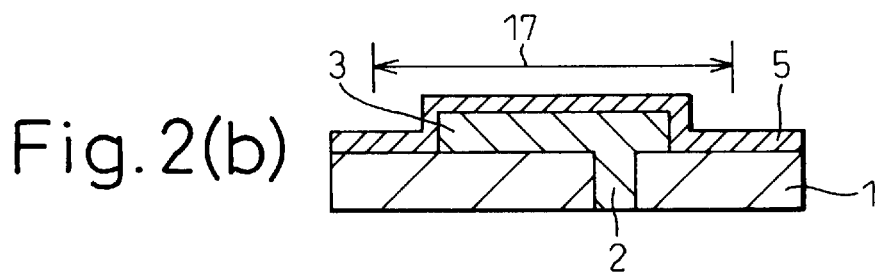

In FIG. 2(a), the conductor pattern 3 and the through-hole plating 2 are formed on the wiring substrate 1 which becomes a core substrate. On the surface of the conductor pattern 3 on the wiring substrate 1, the metallic film layer 5, which includes the lower electrode forming region 17 of the thin film capacitor element 12, by attaching a barrier layer and a metallic layer of tantalum in this order. Specifically, on the entire surface of the conductor pattern 3, a barrier layer (for example, a metallic film of Ti (titanium)) and a metallic film of Ta (tantalum) are attached in this order by either the sputtering method, the chemical vapor phase deposition method (CVD method) or the vapor deposition method. Due to the foregoing, in FIG. 2(b), the conductor pattern 3 including the lower-electrode forming region 17 on the wiring substrate 1 is covered with the metallic film layer 5. The film thickness of the barrier layer on the metallic film layer 5 is, for example, 50 nm to 1 μm. It is preferable that the film thickness of the barrier layer is 100 nm. The film thickness of the metallic film layer of Ta is, for example, 100 nm to 2 μm. It is preferable that the film thickness of the metallic film layer of Ta is 500 nm.

Figure 2C:
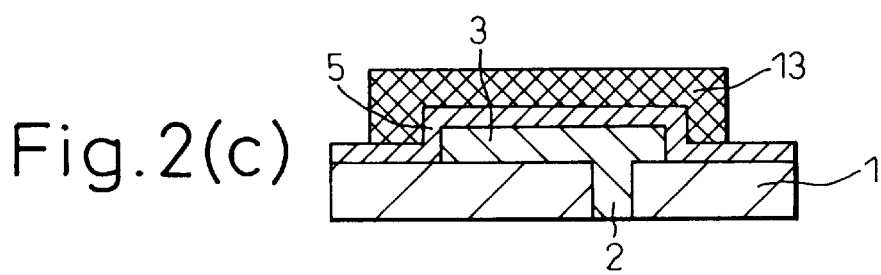

Next, in FIG. 2(c), the lower electrode forming region 17 on the metallic film layer 5 attached onto the conductor pattern 3 is covered with the first resist film 13. Specifically, the first resist film 13 is formed in such a manner that a photosensitive resist is coated on the wiring substrate 1 and subjected to patterning. Then a portion of the metallic film layer 5 not covered with the first resist film 13 is removed by means of etching. The metallic film layer 5 is removed by etching which is conducted by a well known etching solution or by the method of dry etching. After that, the first resist film 13 is peeled off.

Figure 2D:
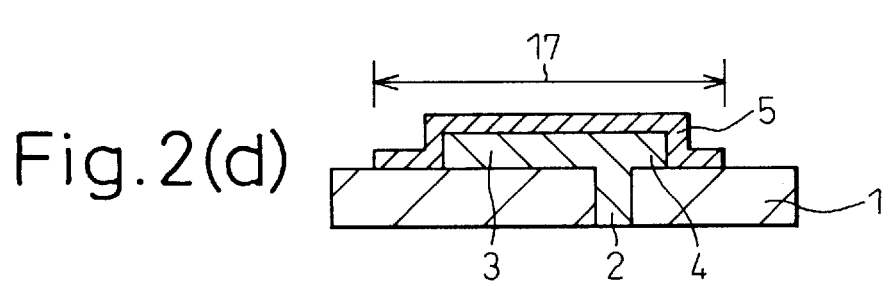

As a result, as shown in FIG. 2(d), on the conductor pattern 3 of the wiring substrate 1, there is formed a conductor pattern on which the metallic film layer 5 is attached in the lower electrode forming region 17 including a portion corresponding to the lower electrode 4.

After that, the multiple layer substrate 16 is formed through the same manufacturing process as that shown in FIGS. 1(d) to 1(g). Except for the metallic film layer 5, the surface of the conductor pattern 3 is covered with the second resist film 14. Next, anodic oxidation is conducted on the wiring substrate 1, so that the anodic oxidation film ($Ta_2O_5$) 6 is formed on the surface of the metallic film layer 5 exposed from the second resist film 14 as shown in FIG. 1(d). The second resist film 14 is peeled off, and the adherence/seed layer 15 is attached onto the surfaces of the anodic oxidation film 6 and the metallic film layer 5 as shown in FIG. 1(e). Then electrolytic copper plating is conducted on the adherence/seed layer 15 by the subtractive method or the semi-additive method so as to provide a thick layer of copper plating, and an unnecessary portion of the adherence/seed layer 15 is removed by means of etching. In this way, the conductor pattern 8, which becomes an upper electrode, and the conductor pattern 7 are formed. Due to the foregoing, the thin film capacitor element 12 is integrally formed on the wiring substrate 1 as shown in FIG. 1(f).

Finally, the insulating resin layer (resin film) 9 is laminated on the wiring substrate 1, and via holes are formed by machining, and then electroless copper plating and electrolytic copper plating are conducted to form a conductor layer (via hole plating 11) from the inner wall of the via hole to the surface of the insulating resin layer 9. Next, patterning is conducted on this conductor layer, and unnecessary copper is removed by means of etching. Due to the foregoing, the surface conductor pattern 10, which is electrically connected with the conductor pattern 8 of the upper electrode and the conductor patterns 3, 7, can be formed as shown in FIG. 1(g).

The preferred embodiments of the present invention are explained above. However, it should be noted that the present invention is not limited to the above specific embodiments. For example, the wiring substrate 1, which becomes a core substrate, may be either a common printed wiring board or a built-up wiring board, and the thin film capacitor element 12 may be used as a connection terminal, that is, variations may be made by one skilled in the art without departing from the spirit and scope of the present invention.

According to the method of manufacturing the multiple layer wiring substrate of the present invention, the thin film capacitor element can be selectively formed only in the necessary portion on the wiring substrate. Therefore, it is possible to ensure the degree of freedom of the wiring design to accomplish an interlayer connection. According to the aforementioned method of manufacturing the multiple layer wiring substrate, the dielectric film is formed by partially conducting anodic oxidization on a specific conductor pattern on the wiring substrate. Therefore, it is possible to form the thin film capacitor elements of various capacities at the same time, and further it is possible to conduct anodic oxidization. Accordingly, it is possible to reduce the rate (percent) of defective dielectric film and enhance the yield of the thin film capacitor element.

It will be understood by those skilled in the art that the foregoing description relates to only some preferred embodiments of the disclosed invention, and that various changes and modifications may be made to the invention without departing the sprit and scope thereof.

What is claimed is:

1. A process for manufacturing a multiple layer wiring board incorporated therein a thin-film capacitor, the process comprising:

forming a metallic film layer consisting of a barrier metal layer and a metal layer possible to be anode oxidized, in this order, on a first conductor pattern formed on an insulating layer;

covering a lower electrode forming region of the thin film capacitor in the first conductor pattern attached to the insulating layer with a first resist film;

etching to remove a portion of the metallic film layer, where the portion is not covered with the first resist film;

removing the first resist film and covering a face of the first conductor pattern, except for a region on the metallic film layer, with a second resist film;

forming an anodic oxidation film on the metallic film layer exposed from the second resist film;

removing the second resist film and attaching an adherence layer and a metal seed layer, in this order, on the anodic oxidation film and on the first conductor pattern; and forming a second conductor pattern, which becomes an upper electrode, on the anodic oxidation film.

2. A process as set forth in claim 1, wherein the upper electrode of the second conductor pattern is formed by attaching the adherence layer and the metal seed layer onto the anodic oxidation film; and forming a thick plated layer on the metal seed layer.

3. A process as set forth in claim 2, wherein the adherence layer and the metal seed layer are attached onto the anodic oxidation film by a sputtering method.

4. A process as set forth in claim 2, wherein the thick plated layer is formed on the metal seed layer by a subtractive method or a semi-additive method.

5. A process as set forth in claim 1 further comprising:

laminating an insulating resin layer on the second conductor pattern including the upper electrode;

drilling the insulating resin layer to form a via hole having a bottom thereof on the upper electrode;

via-hole plating to form a conductor layer extending from an inner wall of the via hole to an upper surface of the insulating resin layer; and etching and patterning the conductor layer to form the second conductor pattern which is connected with the upper electrode.

6. A process as set forth in claim 1, wherein the metallic film layer is form by any one of a sputtering method, a chemical vapor phase deposition (CVD) method, or a vapor deposition method.

* * * * *

UNITED STATES PATENT AND TRADEMARK OFFICE
CERTIFICATE OF CORRECTION

PATENT NO. : 6,754,952 B2
DATED : June 29, 2004
INVENTOR(S) : Akihito Takano et al.

It is certified that error appears in the above-identified patent and that said Letters Patent is hereby corrected as shown below:

<u>Title page,</u>
Item [57], ABSTRACT,
Line 14, change "end" to -- and --.

Signed and Sealed this

Second Day of November, 2004

JON W. DUDAS
*Director of the United States Patent and Trademark Office*